(12) United States Patent
Lin et al.

(10) Patent No.: US 9,520,306 B2
(45) Date of Patent: Dec. 13, 2016

(54) METHOD OF FABRICATING AN INTEGRATED CIRCUIT (IC) PACKAGE HAVING A PLURALITY OF SPACED APART PAD PORTION

(75) Inventors: Geraldine Tsui Yee Lin, Tung Tau Est (HK); Walter de Munnik, Arnhem (NL); Kin Pui Kwan, Lai King (HK); Wing Him Lau, Yuen Long (HK); Kwok Cheung Tsang, Fanling (HK); Chun Ho Fan, Sam Tseng (HK); Neil McLellan, Danville, CA (US)

(73) Assignee: UTAC HEADQUARTERS PTE. LTD., Singapore (SG)

( * ) Notice: Subject to any disclaimer, the term of this patent is extended or adjusted under 35 U.S.C. 154(b) by 145 days.

(21) Appl. No.: 13/618,509

(22) Filed: Sep. 14, 2012

(65) Prior Publication Data

US 2016/0013075 A1    Jan. 14, 2016

Related U.S. Application Data

(60) Division of application No. 11/008,593, filed on Dec. 9, 2004, now Pat. No. 8,330,270, which is a
(Continued)

(51) Int. Cl.
*H01L 21/56*        (2006.01)
*H01L 21/48*        (2006.01)
(Continued)

(52) U.S. Cl.
CPC ......... *H01L 21/561* (2013.01); *H01L 21/4828* (2013.01); *H01L 21/78* (2013.01); *H01L 23/3107* (2013.01); *H01L 23/49503* (2013.01); *H01L 23/49541* (2013.01); *H01L 24/97* (2013.01); *H01L 24/29* (2013.01); *H01L 24/32* (2013.01); *H01L 24/45* (2013.01); *H01L 24/48* (2013.01); *H01L 24/73* (2013.01); *H01L 24/92* (2013.01); *H01L 2224/2919* (2013.01);
(Continued)

(58) Field of Classification Search
CPC .... H01L 21/561; H01L 21/78; H01L 21/4828; H01L 23/495; H01L 23/3107; H01L 23/49503
See application file for complete search history.

(56) References Cited

U.S. PATENT DOCUMENTS 5,126,820 A *  6/1992  Brown .............. H01L 23/49503
                                                        257/420
6,197,615 B1 *  3/2001  Song ................. H01L 23/49503
                                                        257/E23.037
(Continued)

*Primary Examiner* — Minh-Loan Tran
*Assistant Examiner* — Farid Khan
(74) *Attorney, Agent, or Firm* — Winstead PC

(57) ABSTRACT

A process for fabricating an integrated circuit package includes selectively etching a leadframe strip to define a die attach pad and a plurality of contact pads. At least one side of the die attach pad has a plurality of spaced apart pad portions. A semiconductor die is mounted to the die attach pad and wires are bonded from the semiconductor die to respective ones of the contact pads. A first surface of the leadframe strip, including the semiconductor die and wire bonds, is encapsulated in a molding material such that at least one surface of the leadframe strip is exposed. The integrated circuit package is singulated from a remainder of the leadframe strip.

12 Claims, 5 Drawing Sheets

Related U.S. Application Data continuation-in-part of application No. 10/318,262, filed on Dec. 13, 2002, now Pat. No. 6,872,661, which is a division of application No. 09/802,679, filed on Mar. 9, 2001, now Pat. No. 6,635,957, which is a continuation-in-part of application No. 09/288,352, filed on Apr. 8, 1999, now Pat. No. 6,498,099, which is a continuation-in-part of application No. 09/095,803, filed on Jun. 10, 1998, now Pat. No. 6,229,200.

(51) Int. Cl.
*H01L 23/31* (2006.01)
*H01L 23/495* (2006.01)
*H01L 23/00* (2006.01)
*H01L 21/78* (2006.01)

(52) U.S. Cl.
CPC ........... *H01L 2224/32245* (2013.01); *H01L 2224/45144* (2013.01); *H01L 2224/48091* (2013.01); *H01L 2224/48247* (2013.01); *H01L 2224/73265* (2013.01); *H01L 2224/92247* (2013.01); *H01L 2224/97* (2013.01); *H01L 2924/014* (2013.01); *H01L 2924/01027* (2013.01); *H01L 2924/01029* (2013.01); *H01L 2924/01033* (2013.01); *H01L 2924/01047* (2013.01); *H01L 2924/01078* (2013.01); *H01L 2924/01079* (2013.01); *H01L 2924/01082* (2013.01); *H01L 2924/14* (2013.01)

(56) References Cited

U.S. PATENT DOCUMENTS

| | | | |
|---|---|---|---|
| 6,211,462 B1* | 4/2001 | Carter, Jr. | H01L 23/3107 174/522 |
| 6,583,499 B2* | 6/2003 | Huang | H01L 23/3114 257/666 |
| 6,777,788 B1* | 8/2004 | Wan | H05K 3/341 174/528 |
| 7,064,419 B1* | 6/2006 | Bayan | H01L 21/561 257/666 |
| 7,087,986 B1* | 8/2006 | Bayan | H01L 23/3107 257/676 |
| 7,259,460 B1* | 8/2007 | Bayan | H01L 21/568 257/728 |
| 8,106,489 B1* | 1/2012 | Gamboa | H01L 23/3107 257/666 |
| 2001/0009301 A1* | 7/2001 | Azuma | H01L 21/4828 257/698 |
| 2003/0006055 A1* | 1/2003 | Chien-Hung | H01L 23/3107 174/534 |
| 2005/0006735 A1* | 1/2005 | an Tatt | H01L 23/3107 257/676 |

\* cited by examiner

METHOD OF FABRICATING AN INTEGRATED CIRCUIT (IC) PACKAGE HAVING A PLURALITY OF SPACED APART PAD PORTION

RELATED APPLICATIONS

This is a divisional of U.S. patent application Ser. No. 11/008,593, filed Dec. 9, 2004, now U.S. Pat. No. 8,330,270, which is a continuation-in-part of U.S. patent application Ser. No. 10/318,262, filed Dec. 13, 2002, now U.S. Pat. No. 6,872,661, which is a Divisional Application of prior application Ser. No. 09/802,679 filed Mar. 9, 2001, now U.S. Pat. No. 6,635,957, which is a Continuation-In-Part of prior application Ser. No. 09/288,352 filed Apr. 8, 1999, now U.S. Pat. No. 6,498,099 which is a Continuation-In-Part of prior application Ser. No. 09/095,803 filed Jun. 10, 1998, now U.S. Pat. No. 6,229,200.

FIELD OF THE INVENTION

The present invention relates in general to integrated circuit packaging, and more particularly to an integrated circuit package with unique die attach pad features.

BACKGROUND OF THE INVENTION

According to well-known prior art IC (integrated circuit) packaging methodologies, semiconductor dice are singulated and mounted using epoxy or other conventional means onto respective die pads (attach paddles) of a leadframe strip. Traditional QFP (Quad Flat Pack) packages incorporate inner leads which function as lands for wire bonding the semiconductor die bond pads. These inner leads typically require mold locking features to ensure proper positioning of the leadframe strip during subsequent molding to encapsulate the package. The inner leads terminate in outer leads that are bent down to contact a mother board, thereby limiting the packaging density of such prior art devices.

In order to overcome these and other disadvantages of the prior art, the Applicants previously developed a Leadless Plastic Chip Carrier (LPCC). According to Applicants' LPCC methodology, a leadframe strip is provided for supporting up to several hundred devices. Singulated IC dice are placed on the strip die attach pads using conventional die mount and epoxy techniques. After curing of the epoxy, the dice are gold wire bonded to peripheral internal leads. The leadframe strip is then molded in plastic or resin using a modified mold wherein the bottom cavity is a flat plate. In the resulting molded package, the die pad and leadframe inner leads are exposed. By exposing the bottom of the die attach pad, mold delamination at the bottom of the die attach pad (paddle) is eliminated, thereby increasing the moisture sensitivity performance. Also, thermal performance of the IC package is improved by providing a direct thermal path from the exposed die attach pad to the motherboard. By exposing the leadframe inner leads, the requirement for mold locking features of outer leads is eliminated and no outer leads are necessary, thereby increasing device density and reducing package thickness over prior art methodologies. The exposed inner leadframe leads function as solder pads for motherboard assembly such that less gold wire bonding is required as compared to prior art methodologies, thereby improving electrical performance in terms of board level parasitics and enhancing package design flexibility over prior art packages (i.e. custom trim tools and form tools are not required). These and several other advantages of Applicants' own prior art LPCC process are discussed in Applicants' U.S. Pat. No. 6,229,200, issued May 8, 2001, the contents of which are incorporated herein by reference.

In use, the exposed die attach pad and contact pads of Applicant's previously developed LPCC are soldered to the motherboard. To facilitate soldering of the exposed die attach pad and the contact pads, solder paste is printed on the exposed surface of the die attach pad and on the contact pads. The solder paste is reflowed during connection of the package to the motherboard to thereby form a solder joint between the package and the motherboard. During reflow, surface tension of the solder paste on the large die attach pad causes reduced area of coverage of solder paste on the die attach pad and increased height of the solder paste between the die pad and the motherboard. This results in lifting of the package, weakening of the solder attachment between the die attach pad and the motherboard and in extreme cases, causes opening of the input/outputs or disconnection of the contact pads from the motherboard due to increased gap height between the package and the motherboard. Reflowing of solder printed on the surface of the die attach pad and the contact pads results in a solder bump height difference between the solder bump on the large die attach pad and the solder bumps on the smaller contact pads due to surface tension of the solder. Clearly this height difference is undesirable.

Further IC package improvements are desirable and are driven by industry demands for increased reliability, improved thermal and electrical performance and decreased size and cost of manufacture.

SUMMARY OF THE INVENTION

According to one aspect of the present invention, there is provided process for fabricating an integrated circuit package including selectively etching a leadframe strip to define a die attach pad and a plurality of contact pads. At least one side of the die attach pad has a plurality of spaced apart pad portions. A semiconductor die is mounted to the die attach pad and wires are bonded from the semiconductor die to respective ones of the contact pads. A first surface of the leadframe strip, including the semiconductor die and wire bonds, is encapsulated in a molding material such that at least one surface of the leadframe strip is exposed. The integrated circuit package is singulated from a remainder of the leadframe strip.

According to another aspect of the present invention, there is provided an integrated circuit package including a die attach pad. At least one side of the die attach pad has a plurality of spaced apart pad portions. The integrated circuit package also includes a plurality of contact pads circumscribing the die attach pad, a semiconductor die mounted to the die attach pad and a plurality of wire bonds connecting the semiconductor die to ones of the contact pads. A molding material encapsulates the semiconductor die, the wire bonds and at least a surface of each of the die attach pad and the contact pads, such that at least one surface of each of the contact pads and the die attach pad is exposed.

According to still another aspect of the present invention, there is provided a leadframe strip including a plurality of units, each of the units including a die attach pad, at least one side of the die attach pad having a plurality of spaced apart pad portions, and a plurality of contact pads circumscribing the die attach pad.

Advantageously, the side of the die attach pad that includes the plurality of spaced apart pad portions is in the form of an array that is exposed after encapsulation. This provides a number of small surfaces for attachment of the die attach pad to the motherboard. Thus, a number of spaced apart pad portions provide surfaces for solder attachment to the motherboard. Due to the small size of the spaced apart portions, and due to the discontinuity of the exposed side of the die attach pad, lifting of the package during solder reflow on the printed circuit board is reduced. Also, an array of pad portions is provided that improves self-alignment of the package during solder reflow on to the printed circuit board. The individual pad portions are oriented to improve filling during molding and thereby inhibit the entrapment of air during molding.

BRIEF DESCRIPTION OF THE DRAWINGS

The present invention will better understood with reference to the drawings and to the following description, in which.

DETAILED DESCRIPTION OF THE PREFERRED EMBODIMENTS

Figure 1A:
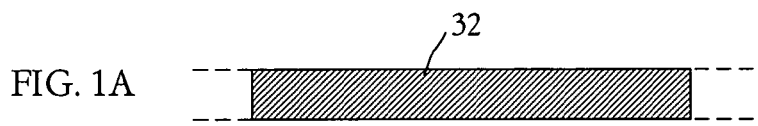
FIGS. 1A, 1B, 1C, 1D, 1E, 1F, 1G, 1H, 1I, and 1J are sectional side views showing processing steps for fabricating integrated circuit packages according to.one embodiment of the present invention.

Referring to the figures, a process for fabricating an integrated circuit package is described. The resulting integrated circuit package is indicated generally by the numeral 20. At least one side of the die attach pad 22 has a number of spaced apart pad portions 36. The integrated circuit package 20 also includes a plurality of contact pads 24 circumscribing the die attach pad 22, a semiconductor die 26 mounted to the die attach pad 22 and a plurality of wire bonds 28 connecting the semiconductor die 26 to ones of the contact pads 24. A molding material 30 encapsulates the semiconductor die 26, the wire bonds 28 and at least a surface of each of the die attach pad 22 and the contact pads 24, such that at least one surface of each of the contact pads 24 and the die attach pad 22 is exposed.

The process for fabricating the integrated circuit package 20 will now be described with particular reference to FIGS. 1A to 1J. For ease of illustration, the Figures show the fabrication of a single integrated circuit package 20. It will be understood, however, that the integrated circuit package 20 is gang fabricated and then singulated by sawing or punching.

With reference to FIG. 1A, there is shown a sectional side view of a copper (Cu) panel substrate which forms the raw material of the leadframe strip 32. As described below, the copper panel substrate is subjected to a selective wet etch process. As discussed in detail in Applicant's U.S. Pat. No. 6,229,200, the contents of which are incorporated herein by reference, the resulting leadframe strip 32 is divided into a plurality of sections, each of which incorporates a plurality of leadframe units in an array (e.g. 3×3 array, 5×5 array, etc.). Only one such unit is depicted in the Figures. Adjacent units being indicated by stippled lines. It will be appreciated that the adjacent units of the leadframe strip 32 are similar to the unit depicted and described herein. Reference is made to a single unit throughout the following description for the purpose of simplicity. As indicated above, the process described is carried out in the fabrication of several units in the array.

Figure 1B:
Figure 1C:
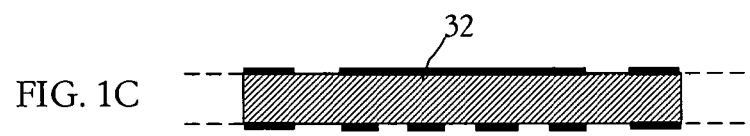

Referring to FIG. 1B, the raw material of the leadframe strip 32 is coated with a layer of photo-imageable solder mask such as a photo-imageable epoxy by spin coating the solder mask.

Next, the layer of photo-imageable etch-resist mask is imaged with a photo-tool. This is accomplished by exposure of the photo-imageable mask to ultraviolet light masked by the photo-tool and subsequent developing of the solder-mask to result in the configuration shown in FIG. 1C. The photo-imageable mask is thereby patterned to provide pits in which the upper and lower surfaces of the leadframe strip 32 are exposed. Thus, the leadframe strip 32 is selectively masked with the photo-imageable mask.

Figure 1D:
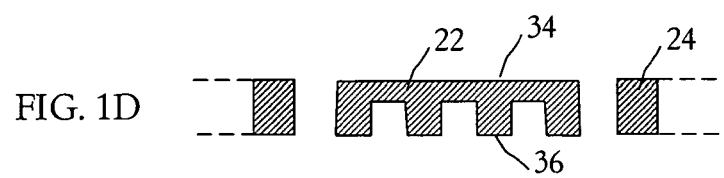

The leadframe strip 32 is then etched, by for example, immersion or pressurized spray etching and the photo-imageable mask is stripped away using conventional means (FIG. 1D). The resulting leadframe strip 32 includes a plurality of units, one of which is shown in the Figures. Each unit includes the generally centrally located die attach pad 22. The die attach pad 22 includes a continuous portion 34 on one side of the die attach pad 24 and the plurality of pad portions 36 that extend from the continuous portion 34, to the opposite side of the die attach pad 22. Each unit also includes the plurality of contact pads 24 that circumscribe the die attach pad 22.

Figure 2A:
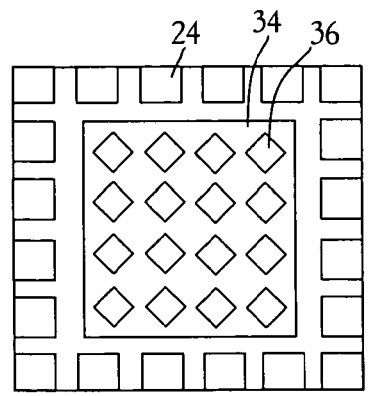
FIGS. 2A and 2B are bottom views of a single unit of a leadframe strip, showing processing steps for fabricating the integrated circuit package that correspond with FIGS. 1D, and 1H, respectively.

As best shown in FIGS. 1D and 2A, the pad portions 36 each have generally square cross-sections in the form of a regular array. The pad portions 36 are oriented such that the sides of the pad portions 36 are not parallel with the sides of the continuous portion 34 of the die attach pad 22. Thus, the sides of the pad portions 36 form an oblique angle with the sides of the continuous portion 34 of the die attach pad 22 (and the molding material that is further described below). In the present embodiment, the sides of the pad portions 36 generally form an angle of about forty-five degrees with the sides of the continuous portion 34 of the die attach pad 22. Thus, the array forms a diamond pattern with pad portions 36 oriented with corners of the pad portions 36 in the direction of the molding material flow (when molding). This aids in molding material flow under the continuous portion 34 of the die attach pad 22 and results in improved filling.

Figure 1E:
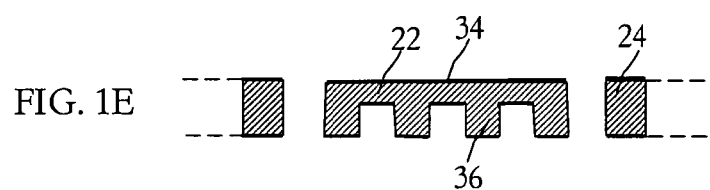

The leadframe strip 32 is then plated with, for example, silver (Ag) or nickel {Ni) and palladium (Pd) to facilitate wire bonding (FIG. 1E).

Figure 1F:
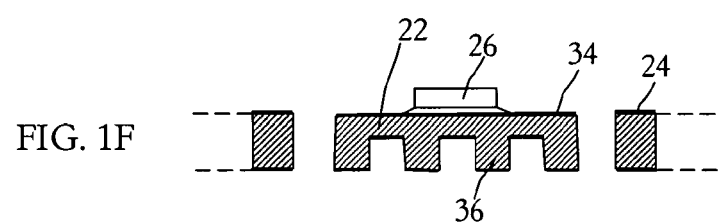
Figure 1G:
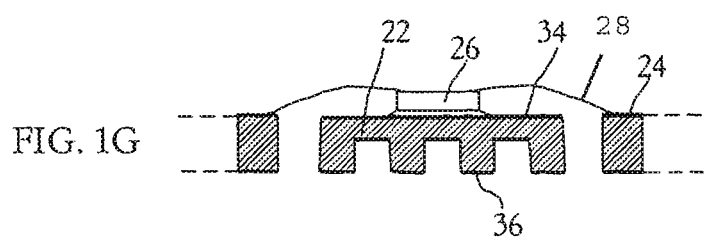

A singulated semiconductor die 26 is then mounted to the continuous portion 34 of the die attach pad 22, using, for example, epoxy (FIG. 1F). Gold wire bonds 28 are then bonded between bond pads of the semiconductor die 26 and the contact pads 24 (FIG. 1G).

Figure 1H:
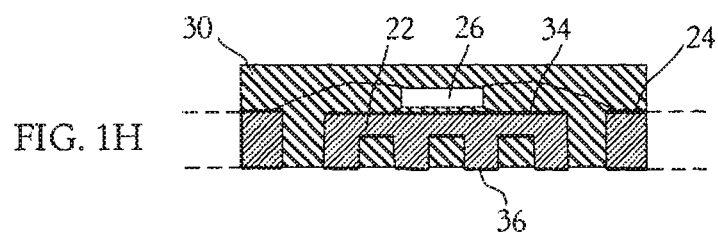

The leadframe strip 32 is then molded using a suitable mold, with the bottom cavity being a flat plate, followed by subsequent curing, as discussed in Applicant's U.S. Pat. No. 6,229,200, issued May 8, 2001 (FIGS. 1Hand 28). As indicated above, the pad portions 36 are oriented with corners of the pad portions 36 pointing in the direction of the molding material flow during molding to aid in the flow of molding material 30 around the pad portions 36 under the continuous portion 34 of the die attach pad 22. Clearly, the sides of the pad portions 36 are oriented at an oblique angle with the sides of the molding material 30 after molding.

Figure 2B:
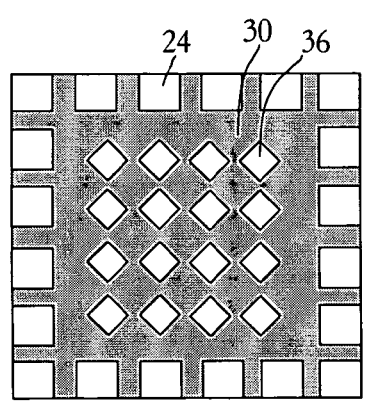

The molding material 30 encapsulates the semiconductor die 26, the wire bonds 28 and all except one surface of the leadframe strip 32. In the orientation shown in FIGS. 1H, a bottom surface of each of the contact pads 24 and a bottom surface each of the pad portions 36 of the die attach pad 22, is exposed. FIG. 2B shows a bottom view of the integrated circuit package of FIG. 1H and best shows the exposed surfaces of the contact pads 24 and the pad portions 36.

Figure 1I:
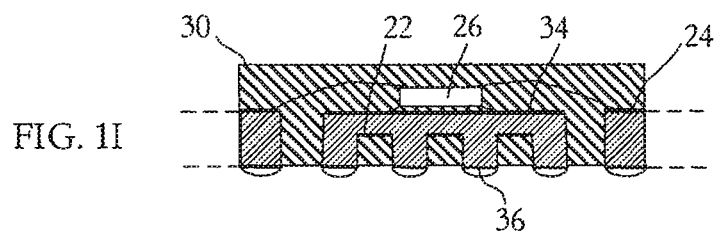

Next, solder paste is applied to the contact pads 24 and to the pad portions 36 by screen printing, as will be understood by those skilled in the art. After solder paste printing, the solder is reflowed using known reflow technique (FIG. 1I).

Figure 1J:
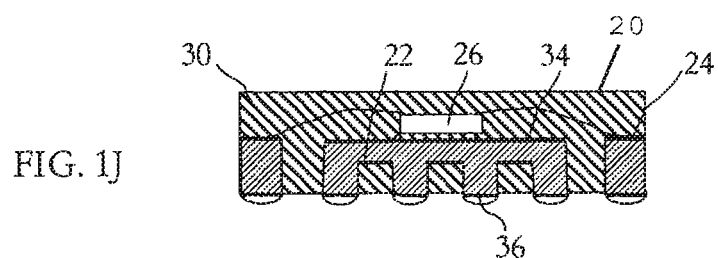

Singulation of the individual integrated circuit package 20 follows removal of the leadframe strip 32 from the mold, resulting in the integrated circuit package 20 as shown in FIG. 1J. Singulation is performed by, for example, saw singulation.

Figure 3A:
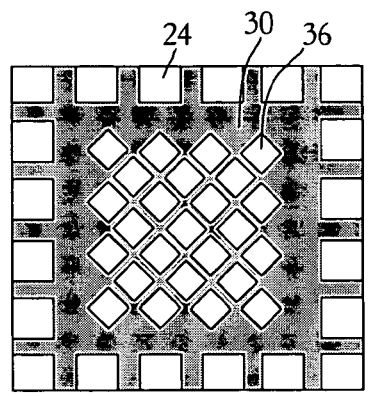
FIGS. 3A and 3B show bottom views of a single integrated circuit package according to alternative embodiments of the present invention.
Figure 3B:
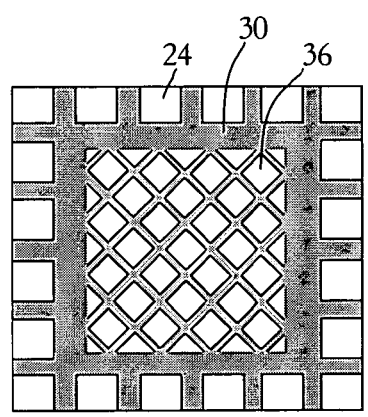

It will be appreciated that although a particular embodiment of the invention has been described and illustrated, various changes and modifications may occur to those skilled in the art. For example, rather than saw singulation, singulation may be performed by punching. Also, rather than the arrangement of the pad portions 36 shown in FIG. 2B, other arrangements are possible, without departing from the scope of the present invention. Exemplary alternative arrangements are shown in FIGS. 3A and 3B.

Figure 4:
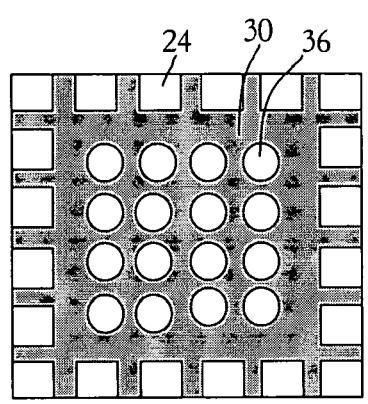
FIG. 4 shows a bottom view of a single integrated circuit package according to another embodiment of the present invention.

Reference is made to FIG. 4, which shows a bottom view of a single integrated circuit package according to another embodiment of the present invention. In this embodiment of the present invention, the pad portions 36 have generally circular cross-sections and are spaced in a regular array. Thus, the pad portions are rounded, thereby aiding in molding material flow under the continuous portion 34 of the die attach pad 22, resulting in improved filling. The remainder of the features of the integrated circuit package 20 according to the present embodiment and the process for fabricating the integrated circuit package 20 are similar to the features and process for the first-described embodiment and therefore are not further described herein.

Still other variations and modifications may occur to those skilled in the art. All such changes and modifications may be made without departing from the sphere and scope of the present invention.

What is claimed is:

1. A process for fabricating an integrated circuit package, comprising:
   providing a leadframe strip having an upper surface and a lower surface;
   applying an etch-resist mask to the upper and lower surfaces;
   patterning the etch-resist mask to expose portions of the upper and lower surfaces;
   selectively etching both the upper and lower surfaces of the leadframe strip by completely etching through portions of the leadframe strip to define a die attach pad and a plurality of contact pads, and only partially etching through portions of the leadframe strip to form a plurality of spaced apart pad portions on the lower surface;
   mounting a semiconductor die to said die attach pad;
   wire bonding said semiconductor die to respective ones of said contact pads;
   encapsulating the upper surface of said leadframe strip, said semiconductor die, and wire bonds in a molding material, the lower surface of said leadframe strip being exposed; and
   singulating said integrated circuit package from a remainder of said leadframe strip.

2. The process according to claim 1, wherein said selectively etching comprises selectively etching such that said plurality of pad portions are shaped and oriented to inhibit entrapment of air during encapsulation.

3. The process according to claim 1, wherein said selectively etching comprises selectively etching said leadframe strip to define a continuous portion on a first side of the die attach pad and said plurality of pad portions extending from the continuous portion to a second side of the die attach pad.

4. The process according to claim 3, wherein mounting said semiconductor die comprises mounting said semiconductor die to said first side of the die attach pad.

5. The process according to claim 4, wherein said selectively etching comprises selectively etching to provide said plurality of pad portions wherein each of said pad portions have a generally square cross-section.

6. The process according to claim 4, wherein said selectively etching comprises selectively etching to provide said plurality of pad portions wherein each of said pad portions have a generally circular cross-section.

7. The process according to claim 5, wherein said selectively etching comprises selectively etching to provide said pad portions in a diamond pattern such that sides of said pad portions form an oblique angle with sides of said molding material.

8. The process according to claim 1, wherein the pad portions form an array.

9. The process according to claim 1, wherein said selectively etching comprises selectively etching to provide said die attach pad such that each of said plurality of pad portions have a generally square cross-section.

10. The process according to claim 1, wherein said selectively etching comprises selectively etching to provide said die attach pad such that each of said plurality of pad portions have a generally circular cross-section.

11. The process according to claim 9, wherein said selectively etching comprises selectively etching to provide said pad portions in a diamond pattern in which sides of said pad portions are at an oblique angle with sides of said molding material.

12. The process according to claim 1, further comprising applying solder paste to the plurality of contact pads and to said at least one side of said die attach pad.

* * * * *